US011869956B2

(12) United States Patent
Nandakumar

(10) Patent No.: US 11,869,956 B2
(45) Date of Patent: Jan. 9, 2024

(54) CHANNEL STOP AND WELL DOPANT MIGRATION CONTROL IMPLANT FOR REDUCED MOS THRESHOLD VOLTAGE MISMATCH

(71) Applicant: TEXAS INSTRUMENTS INCORPORATED, Dallas, TX (US)

(72) Inventor: Mahalingam Nandakumar, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/490,558

(22) Filed: Sep. 30, 2021

(65) Prior Publication Data

US 2023/0095534 A1 Mar. 30, 2023

(51) Int. Cl.
*H01L 21/266* (2006.01)
*H01L 29/78* (2006.01)
*H01L 29/66* (2006.01)
*H01L 21/265* (2006.01)

(52) U.S. Cl.
CPC .... *H01L 29/66537* (2013.01); *H01L 21/2652* (2013.01); *H01L 21/26586* (2013.01); *H01L 29/66492* (2013.01); *H01L 29/7838* (2013.01)

(58) Field of Classification Search
CPC .................. H01L 21/265–266; H01L 29/1083
See application file for complete search history.

(56) References Cited

U.S. PATENT DOCUMENTS

| | | | | |
|---|---|---|---|---|
| 4,369,072 A * | 1/1983 | Bakeman, Jr. | ...... | H01L 29/0847 257/E21.337 |
| 5,723,896 A * | 3/1998 | Yee | ................... | H01L 21/26506 257/E21.564 |
| 5,825,066 A * | 10/1998 | Buynoski | ............ | H01L 21/2658 257/E21.336 |
| 6,506,640 B1 * | 1/2003 | Ishida | ................... | H01L 29/105 257/E21.336 |

(Continued)

OTHER PUBLICATIONS

Martin D. Giles; "Transient Phosphorus Diffusion from Silicon and Argon Implantation Damage"; Appl. Phys. Lett. 62 (16), Apr. 19, 1993; 3 pgs.

*Primary Examiner* — Eric A. Ward
(74) *Attorney, Agent, or Firm* — Andrew R. Ralston; Frank D. Cimino

(57) ABSTRACT

A channel stop and well dopant migration control implant (e.g., of argon) can be used in the fabrication of a transistor (e.g., PMOS), either around the time of threshold voltage adjust and well implants prior to gate formation, or as a through-gate implant around the time of source/drain extension implants. With its implant depth targeted about at or less than the peak of the concentration of the dopant used for well and channel stop implants (e.g., phosphorus) and away from the substrate surface, the migration control implant suppresses the diffusion of the well and channel stop dopant to the surface region, a more retrograde concentration profile is achieved, and inter-transistor threshold voltage mismatch is improved without other side effects. A compensating through-gate threshold voltage adjust implant (e.g., of arsenic) or a threshold voltage adjust implant of increased dose can increase the magnitude of the threshold voltage to a desired level.

25 Claims, 12 Drawing Sheets

(56) References Cited

U.S. PATENT DOCUMENTS

| | | | |
|---|---|---|---|
| 2004/0137687 A1* | 7/2004 | Feudel | H01L 21/26506 257/E21.336 |
| 2004/0238858 A1* | 12/2004 | Haga | H01L 21/2658 257/E21.336 |
| 2009/0057678 A1* | 3/2009 | Goldbach | H01L 21/324 257/66 |
| 2021/0272812 A1* | 9/2021 | Adusumilli | H01L 21/26533 |

* cited by examiner

US 11,869,956 B2

CHANNEL STOP AND WELL DOPANT MIGRATION CONTROL IMPLANT FOR REDUCED MOS THRESHOLD VOLTAGE MISMATCH

TECHNICAL FIELD

This description relates generally to semiconductor fabrication, and more particularly to implantation of a channel stop and well dopant migration control implant to reduce threshold voltage mismatch in metal-oxide-semiconductor transistors.

BACKGROUND

Integrated circuits (ICs) can be fabricated, for example, using an advanced complementary metal oxide semiconductor (CMOS)/linear bipolar CMOS (BiCMOS) process, in which a variety of devices such as diodes, resistors, bipolar junction transistors, power MOS and CMOS transistors may be fabricated on a single IC. The IC can be fabricated on a larger semiconductor wafer that can be placed on a platen in an implant chamber capable of directing an ion beam at the wafer to implant ions into the wafer. The rotation angle of the platen can be adjusted relative to the incident beam to provide a number of "rotations" for each implant, and the tilt angle of the platen can be adjusted relative to the incident beam to provide implants of different tilt angles relative to the normal of the surface of the wafer. As an example, for an ion implantation into a given transistor, a "four-rotation" process is one in which an implant is performed four times, each time at a different rotation angle of the platen. As another example, a "0° implant" is one in which the implant beam is directed straight down, normal to the wafer.

For high-performance CMOS transistors, channel profile and source/drain extension engineering may be used, in which a gate is deposited on top of an active area that is doped to form source/drain regions, as well as adjacent source/drain extensions, which are also known as lightly-doped drains (LDDs) or heavily-doped drains (HDDs), depending on the level of doping. The active area of each transistor may be individually surrounded on the wafer by isolation barriers (formed, e.g., from oxide), which can promote electrical isolation of adjacent transistors on the IC. In some examples, transistors can be configured for use in analog circuitry, such as differential amplifiers, in which matched transistor pairs having very low mismatch are desired.

Shallow trench isolation (STI), also known as box isolation, is an integrated circuit feature used to prevent current leakage between adjacent semiconductor devices. STI structures can be formed early in the semiconductor device fabrication process flow, before transistors are formed, by, for example, etching a pattern of trenches in the silicon substrate, depositing one or more dielectric materials (e.g., silicon dioxide or some other oxide) to fill the trenches, and removing the excess dielectric (e.g., using chemical-mechanical planarization). Use of STI structures can reduce the threshold voltage $V_t$ for narrower transistor widths and can increase subthreshold leakage current.

SUMMARY

One example is a method of fabricating an integrated circuit. A first implant is performed into a transistor region of a semiconductor substrate thereby producing an arsenic or antimony profile having a peak concentration at a first depth. A second implant is performed into the transistor region thereby producing a phosphorus profile having a peak concentration at a second depth greater than the first depth. A third implant is performed into the transistor region thereby producing an argon profile having a peak concentration at a third depth greater than the first depth.

An example metal-oxide-semiconductor (MOS) transistor includes a semiconductor substrate having a well region having a first conductivity type. The MOS transistor further includes a gate formed over the well region. The MOS transistor further includes a source/drain region and a source/drain extension to the source/drain region formed near the surface, both having a second conductivity type, the source/drain extension extending under the gate. The MOS transistor further includes a threshold voltage adjust implant region having the first conductivity type and at a first implant profile peak depth within the semiconductor substrate. The MOS transistor further includes a channel stop implant region having the first conductivity type and at a second implant profile peak depth within the semiconductor substrate that is deeper than the first implant profile peak depth. The MOS transistor further includes a channel stop/well dopant migration control implant region at a third implant profile peak depth that is about at or less than the second implant profile peak depth.

Another example is a method of fabricating a MOS transistor. A threshold voltage adjust implant is performed into a semiconductor substrate to a first target depth. A channel stop implant is performed into the semiconductor substrate to a second target depth that is deeper than the first target depth. A well implant is performed into the semiconductor substrate to a third target depth that is deeper than the second target depth. A channel stop/well dopant migration control implant is performed into the semiconductor substrate to a fourth target depth that is about at or less than the third target depth.

DETAILED DESCRIPTION

Figure 1:
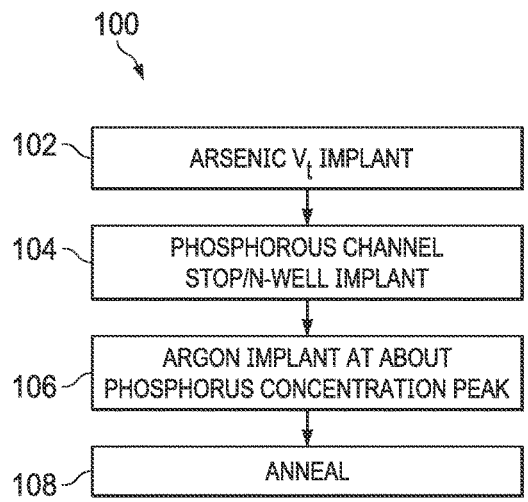
FIG. 1 is a flow chart showing an example method of fabricating a PMOS transistor using a phosphorus migration control implant of argon to maintain a retrograde concentration profile of phosphorus.

In the fabrication of integrated circuit (IC) devices, it can often be important for adjacent transistors (e.g., those placed within about tenth of a micron to twelve microns of each other on a chip), and particularly those transistors used as matched pairs (e.g., in operational amplifiers), to have low mismatch. "Mismatch" can refer to a comparison of various parametrics, such as threshold voltage $V_t$, between two transistors. Factors affecting mismatch include variations in gate dielectric (e.g., gate oxide) thickness and doping profile, the latter of which tends to dominate for larger transistors (e.g., those having gate lengths one micron or greater) that are used in analog circuitry. In accordance with the Pelgrom relationship, increasing transistor size can be one way of reducing mismatch, but larger device sizes have drawbacks, such as occupying larger area on chip. Thermally grown gate oxides can be well controlled for thickness, and gate oxides can be precisely nitrided to control their properties, such that gate oxide fabrication techniques do not present much opportunity for reduction of mismatch. Transistor fabrication techniques involving variation in the doping profile in a MOS transistor channel may offer greater opportunity for mismatch reduction. Transistor mismatch can be improved, for example, using retrograde channel doping concentration profiles, in which dopant concentrations are higher in regions deeper in the channel, and are reduced in regions closer to the transistor surface. A retrograde profile refers to a dopant concentration that increases from the surface of the substrate to a location having a peak concentration, which is spaced from the surface of the substrate, and then decreases from the location having the peak concentration further away from the surface of the substrate. However, combating $V_t$ mismatch, particularly in PMOS transistors, has posed a difficult problem over many years of otherwise fruitful transistor development.

In PMOS transistors, a retrograde channel doping concentration profile can be achieved by using a heavy PMOS threshold voltage adjust implant (referred to as a $V_t$ implant) dopant species such as phosphorous, arsenic, or antimony. When high-energy phosphorus implants are used for well and channel stop implants along with the $V_t$ implant, phosphorus ions implanted as the well and channel stop implants tend to diffuse to the surface upon anneal and smear out the retrograde arsenic or antimony $V_t$ implant concentration profile (ion concentration as a function of distance from a surface of a substrate, which distance is also referred to as depth). The phosphorus diffusion upon anneal results in an arsenic/antimony/phosphorus concentration profile that is substantially flat and non-retrograde, leading to greater inter-device mismatch and thus degradation of performance of matched transistors. A high-dose carbon implant can be used to suppress the phosphorus diffusion, but may unacceptably increase junction leakage.

To address $V_t$ implant smearing in PMOS transistors, an argon implant can be added at a $V_{tp}$ implant processing step, which is sometimes referred to as a standard n-well (SNW) processing step. Additionally or alternatively, argon can be implanted, in some examples along with an arsenic or antimony $V_t$ implant, through the gate at a source/drain extension (PLDD) implant processing step. Irrespective of the processing step at which it is implanted, the argon implant can serve as a local source of interstitials, accelerating phosphorus diffusion to the location of the argon implant. With appropriate positioning of the argon implant away from the substrate surface, for example, near one or both of the respective peaks of the well and/or channel stop implant profiles, the diffusion of phosphorus to the surface region can be suppressed, and transistor mismatch can thereby be reduced. The properties of the argon implant can thus be beneficially leveraged to modify the interstitial phosphorus diffusion and create a retrograde-type arsenic/antimony/phosphorus concentration profile in the channel of a MOSFET without creating undesirable side effects.

In some PMOS examples, the channel stop and well dopant migration control implant of argon can be implanted as a blanket implant (one affecting all transistors on the IC whether targeted or not) at around the same time in the fabrication process flow as $V_t$, channel stop, and well implants. The result of this migration control implant, following a post-implant anneal, is effective redistribution the phosphorus, such that the phosphorus does not migrate close to the surface and smear the retrograde arsenic or antimony $V_t$ implant concentration profile. In other PMOS examples, implanting argon through a polysilicon gate of the transistor and positioning it between about 0.03 microns and about 0.05 microns away from the silicon interface can have a similar effect, resulting in a retrograde phosphorus channel profile and leading to an improvement in (reduction of) mismatch. Irrespective of which of these alternatives is implemented to provide the argon implant, the argon implant can advantageously be provided without a requirement to add masks to the process flow. Added production costs can thereby be avoided. Additional implantation of arsenic or antimony, e.g., through the gate, can also help create a retrograde channel profile and improve the threshold voltage.

FIG. 1 is a flow chart 100 illustrating an example method of fabricating an integrated circuit, such as having a transistor, such as a PMOS transistor. A threshold voltage adjust implant of arsenic or antimony is implanted 102 into a transistor region of a semiconductor substrate to a first target depth (measured as a distance from the surface of the semiconductor substrate). Implantation 102 produces an arsenic or antimony profile having a peak concentration at about the first target depth. At least one of a channel stop implant of phosphorus or an n-well implant of phosphorus is implanted 104 into the semiconductor substrate to a second target depth that is greater than (deeper than) the first target depth. Implantation 104 produces a phosphorus profile having a peak concentration at about the second target depth. A phosphorus migration control implant of argon is implanted 106 into the semiconductor substrate to a third target depth. Implantation 106 produces an argon profile having a peak concentration at about the third target depth. In some examples, the third target depth is greater than the first target depth. In some examples, the third target depth is about at, or less than (shallower than), the second target depth, e.g., about equal to the second target depth. In some examples, the third target depth is within ±250 nanometers of the second target depth. The phosphorus migration control implant is configured to inhibit, and is effective to inhibit, the phosphorous ions of the channel stop implant or n-well implant from migrating to shallower than the first target depth upon an anneal 108 that follows the implants. The phosphorus migration control implant of argon can be performed prior to formation of a gate on the PMOS transistor or can be performed as a through-gate implant after gate formation. In some examples, implantation 104 can be provided as multiple (e.g., two) separate implantations, each targeted to a different depth. As an example, a first dopant control migration implant can be targeted to about at or shallower than the peak concentration depth of a channel stop implant, and a second dopant control migration implant can be target to about at or shallower than the peak concentration depth of a well implant. For example, where a well implant creates a second peak dopant concentration of phosphorus that is distinct from that created by a channel stop implant, a second dopant migration control implant can be targeted to a depth within ±250 nanometers of the depth of the second peak dopant concentration of phosphorus.

When performed prior to gate formation, the phosphorus migration control implant of argon can be performed 106, for example, at an implant energy of between about 150 keV and about 600 keV with a dose (dopant atom surface flux) of between about $1\times10^{13}$ ions/cm$^2$ and about $1\times10^{14}$ ions/cm$^2$. When performed prior to gate formation, the phosphorus migration control implant of argon can, for example, be performed 106 in a four-rotation process at beam tilt angles of between about 0° from the vertical and about 100 from the vertical. The through-gate phosphorus migration control implant of argon can, for example, be performed 106 at an energy of between about 150 keV and about 250 keV with a dose of between about $1\times10^{13}$ ions/cm$^2$ and about $1\times10^{14}$ ions/cm$^2$. The through-gate phosphorus migration control implant of argon can be performed 106 at beam tilt angles of between about 0° and about 30°. Implants 102, 104, 106 can take place in any order with respect to each other, and the illustrated order is only an example.

In some examples, a second threshold voltage adjust implant of arsenic or antimony can be performed (not shown in FIG. 1) as a through-gate implant. This second threshold adjust implant of arsenic can, for example, be performed at an energy of between about 200 keV and about 300 keV with a dose of between about $1\times10^{12}$ ions/cm$^2$ and about $1\times10^{13}$ ions/cm$^2$ at atilt angle of between about 0° and about 30°. In other examples, rather than performing a second through-gate threshold voltage adjust, the initial threshold voltage adjust implant of arsenic is performed 102 at an energy of about 40 keV with a dose of between about $1\times10^{11}$ ions/cm$^2$ and about $1\times10^{13}$ ions/cm$^2$, e.g., about $1\times10^{12}$ ions/cm$^2$ or about $3\times10^{12}$ ions/cm$^2$. In still other examples, only one arsenic threshold adjust implant is performed and it is a through-gate implant.

Figure 2:
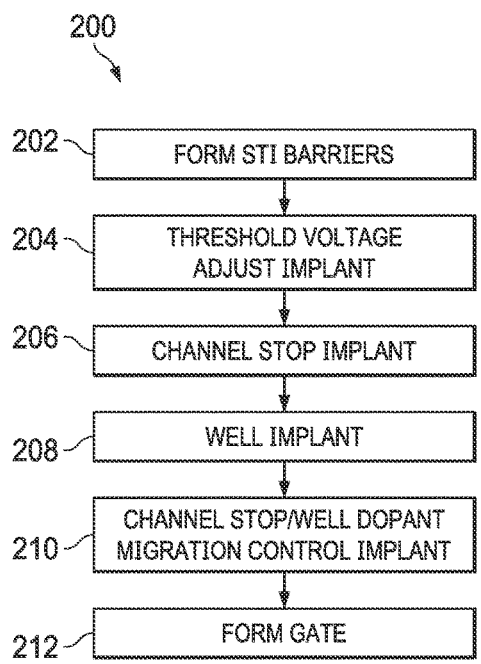
FIG. 2 is a flow chart showing an example method of fabricating a MOS transistor using a channel stop and well dopant migration control implant along with the threshold voltage adjust, channel stop, and well implants.

FIG. 2 is a flow chart 200 illustrating an example method of fabricating a MOS transistor. Isolation structures are formed 202 in a semiconductor substrate. As an example, the isolation structure is a shallow trench isolation (STI) structure formed within the semiconductor substrate. In other examples, other types of isolation technologies may be used to provide isolation, such as field oxidation regions, e.g., local oxidation of silicon (LOCOS) regions, or implanted isolation regions. A threshold voltage adjust dopant is implanted 204 into the semiconductor substrate to a first target depth. A channel stop dopant is implanted 206 into the semiconductor substrate to a second target depth that is deeper than the first target depth. A well dopant, which can be the same species as the channel stop dopant, is implanted 208 into the semiconductor substrate to a third target depth that is deeper than the second target depth. Implants 204, 206, 208 can be performed in any order with respect to each other, and not just in the example order of increasing depth as illustrated in FIG. 2. A channel stop/well dopant migration control dopant (e.g., argon for PMOS, or carbon and/or nitrogen for NMOS) is implanted 210 into the semiconductor substrate to a fourth target depth that is at or near the third target depth. In the illustrated example 200, migration control implant 210 is performed before formation 212 of a gate, such as around the same time in the fabrication process flow as any of the respective implants 204, 206, 208.

Figure 3:
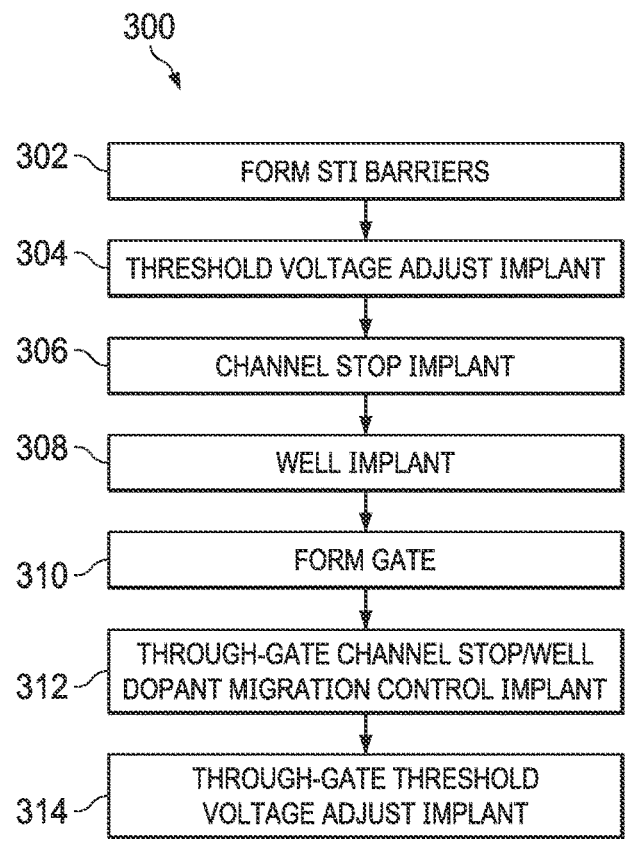
FIG. 3 is a flow chart showing an example method of fabricating a MOS transistor using a through-gate channel stop and well dopant migration control implant.

FIG. 3 is a flow chart illustrating an example method 300 of fabricating a MOS transistor, which includes similar fabrication operations as illustrated in FIG. 2. For example, operations 302, 304, 306, 308 in method 300 can be performed to include the same operations as in method 200, and can respectively correspond to operations 202, 204, 206, 208. By contrast, in method 300 illustrated in FIG. 3, the migration control implant is performed 312 after the formation 310 of the gate as a through-gate implant. In method 300, isolation structures (e.g., STI structures) are formed 302 in a semiconductor substrate. A threshold voltage adjust dopant is implanted 304 into the semiconductor substrate to a first target depth. A channel stop dopant is implanted 306 into the semiconductor substrate to a second target depth that is deeper than the first target depth. A well dopant, which can be the same as the channel stop dopant, is implanted 308 into the semiconductor substrate to a third target depth that is deeper than the second target depth. Implants 304, 306, 308 can be performed in any order with respect to each other, and not just in the example order of increasing depth as illustrated in FIG. 3. After gate formation 310, a channel stop/well dopant migration control dopant (e.g., argon for PMOS or carbon or nitrogen for NMOS) is implanted 312 through the gate into the semiconductor substrate to a fourth target depth that is at or near the third target depth.

In each of methods 200, 300, the MOS transistor can be, for example, a PMOS transistor, in which case the threshold voltage adjust implant 204, 304 can be of arsenic or antimony, the channel stop and well implants 206, 306, 208, 308 can both be of phosphorus, and the channel stop/well dopant migration control implant 210, 312 can be of argon. In each of methods 200, 300, the threshold voltage adjust implant 204, 304 can be a through-gate implant performed after gate formation, or the threshold voltage adjust implant can be a first threshold voltage adjust implant 304 that is performed prior to gate formation, and the method can further include a second threshold voltage adjust implant 314 (e.g., of arsenic or antimony for PMOS) that is a through-gate implant performed after gate formation. In example methods having multiple migration control implantations, one or more of them can be performed 210 prior to gate formation and one or more of them can be performed 312 as through-gate implants.

Figure 4A:
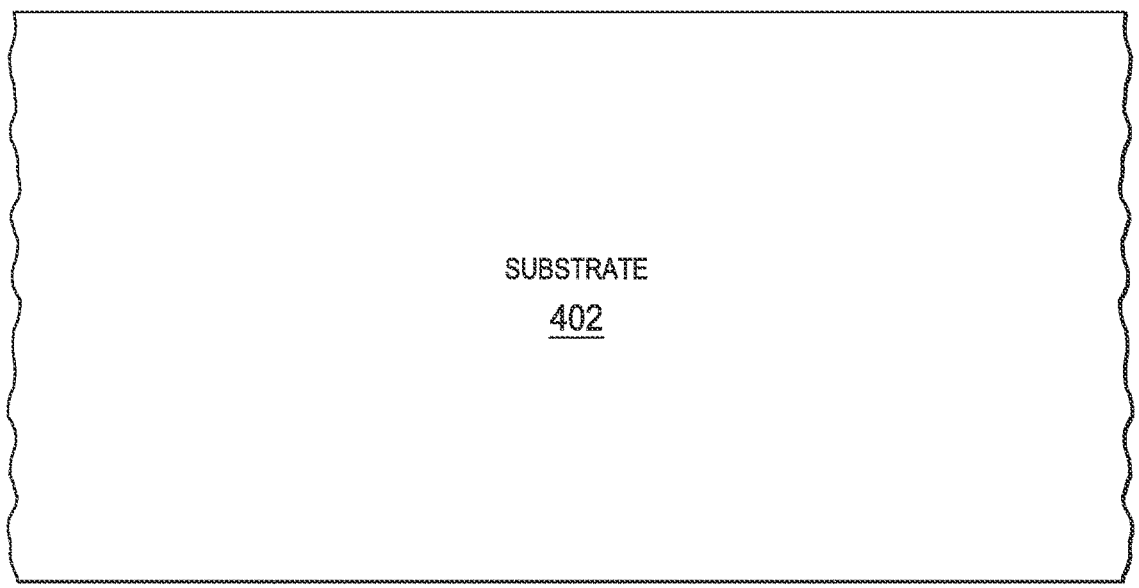
FIGS. 4A through 4I are cross-sectional views of an example transistor showing the transistor at different stages of a baseline fabrication process flow.
Figure 4B:
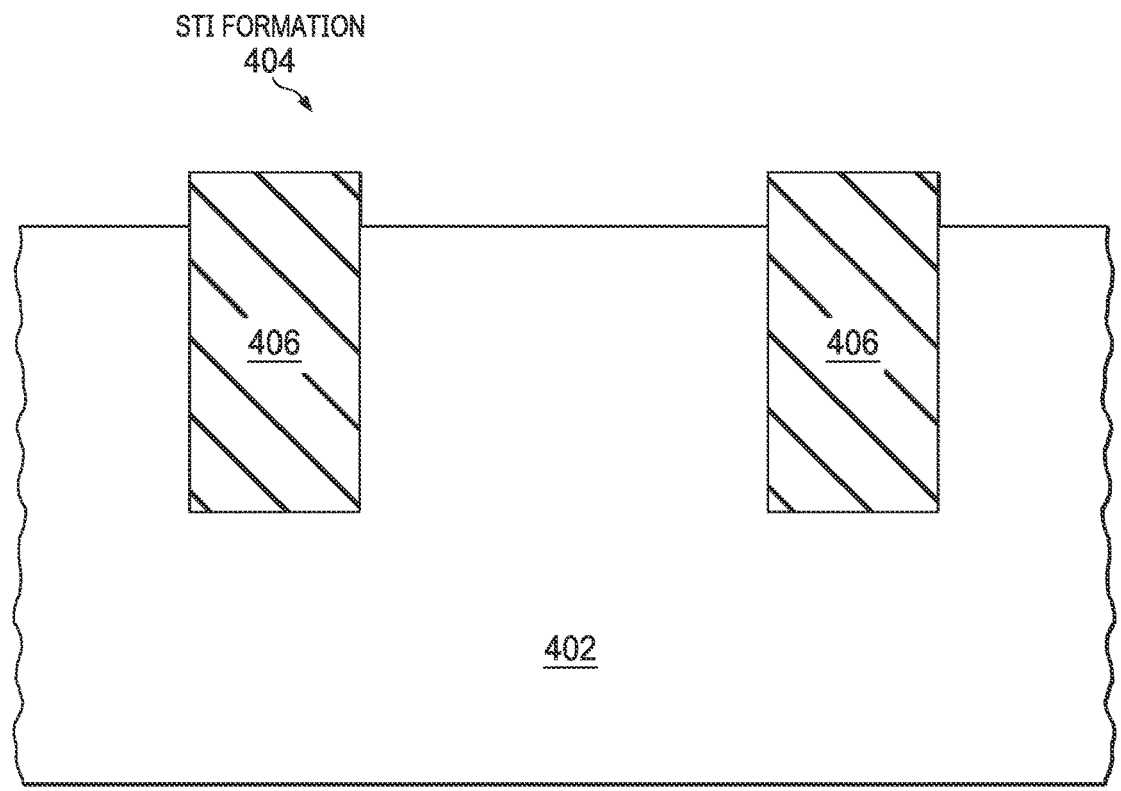
Figure 4C:
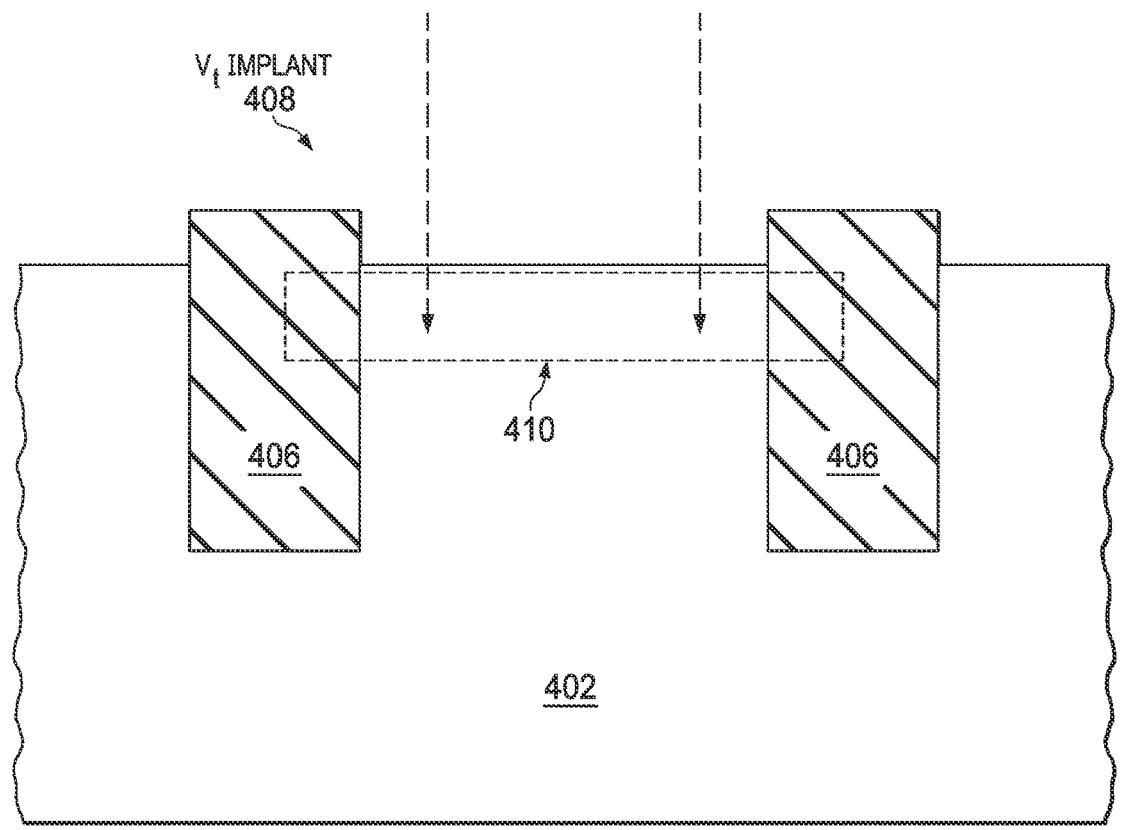
Figure 4D:
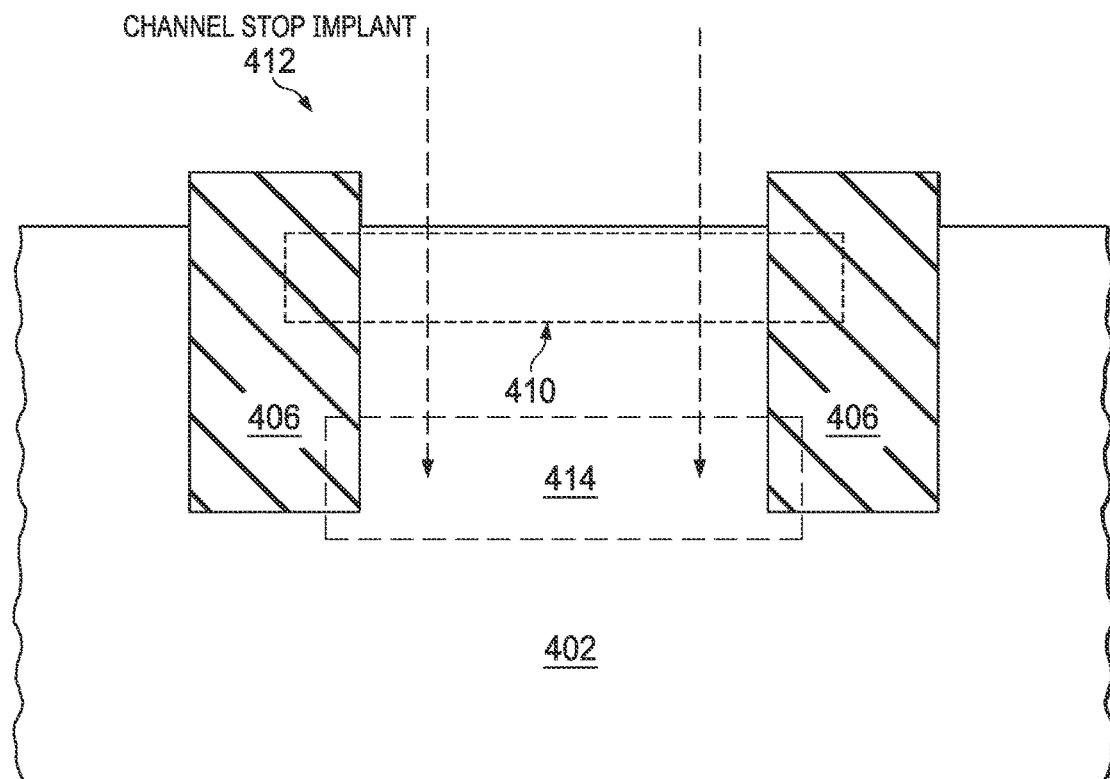
Figure 4E:
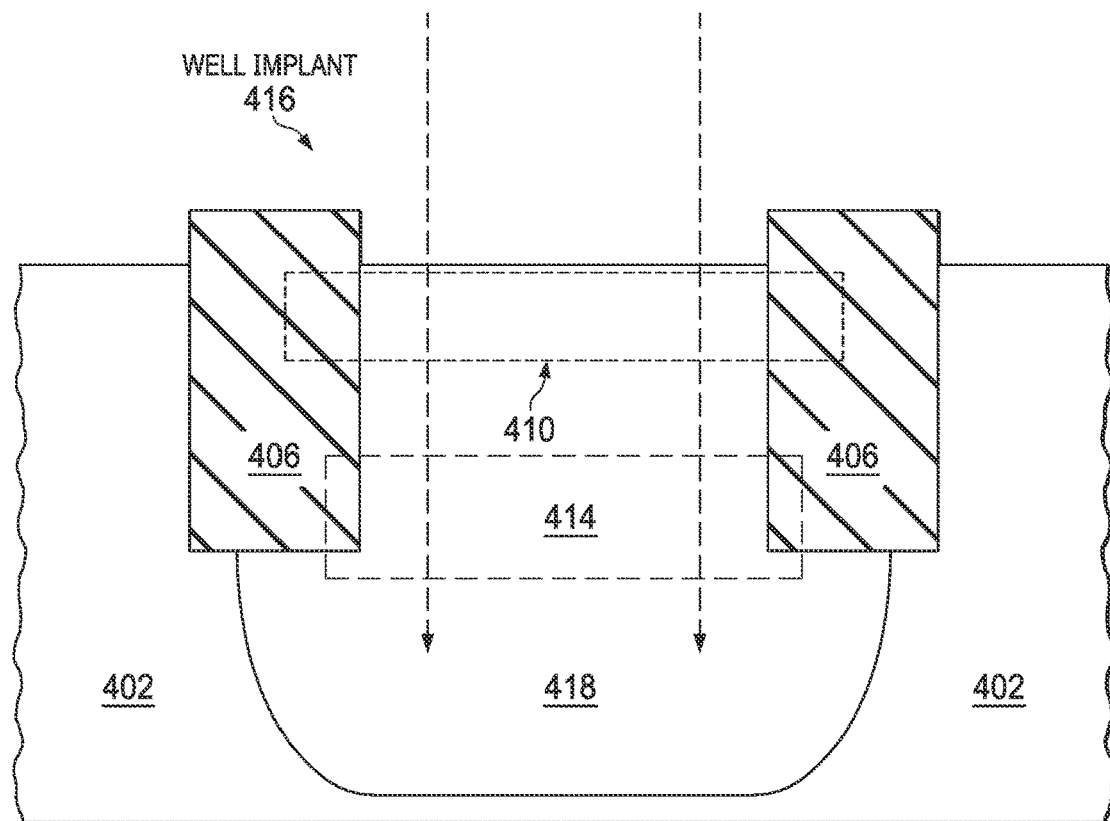
Figure 4F:
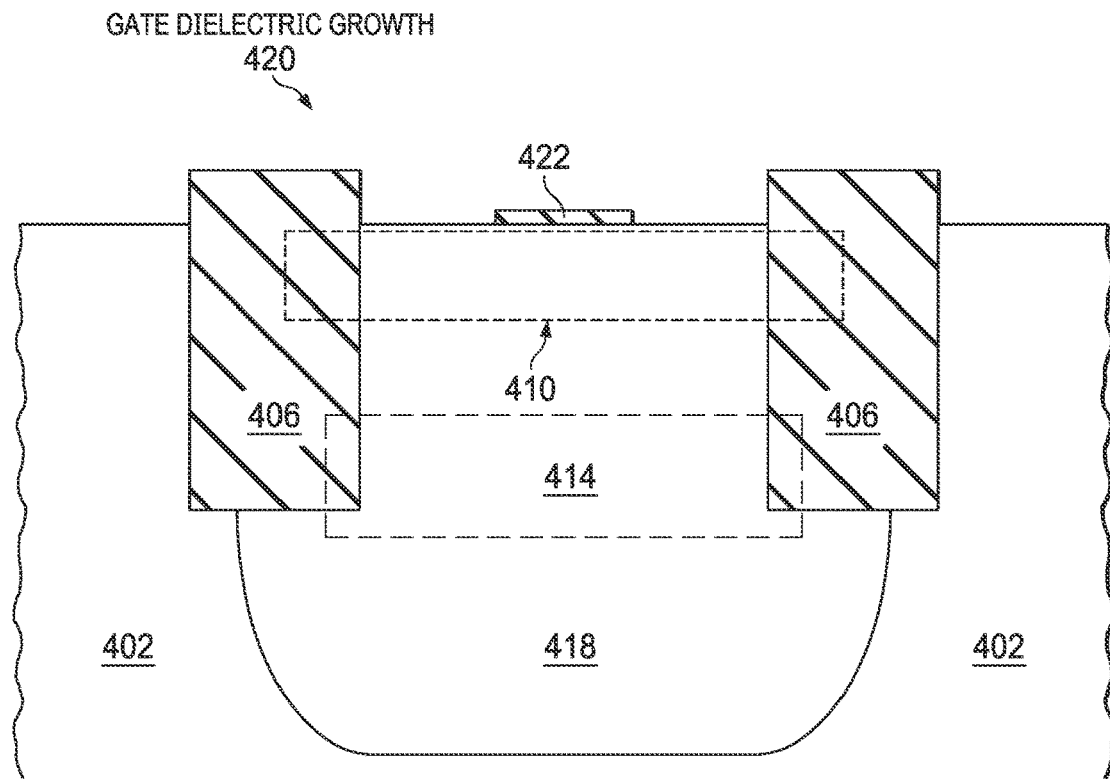
Figure 4G:
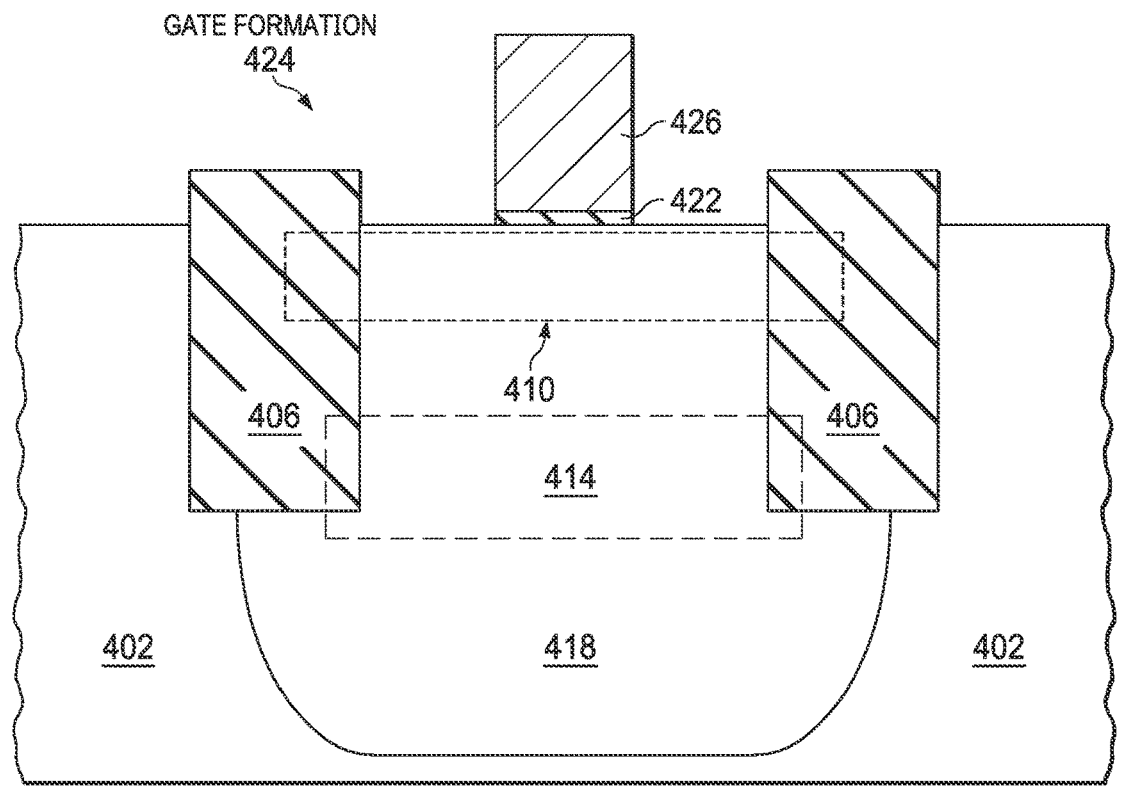
Figure 4H:
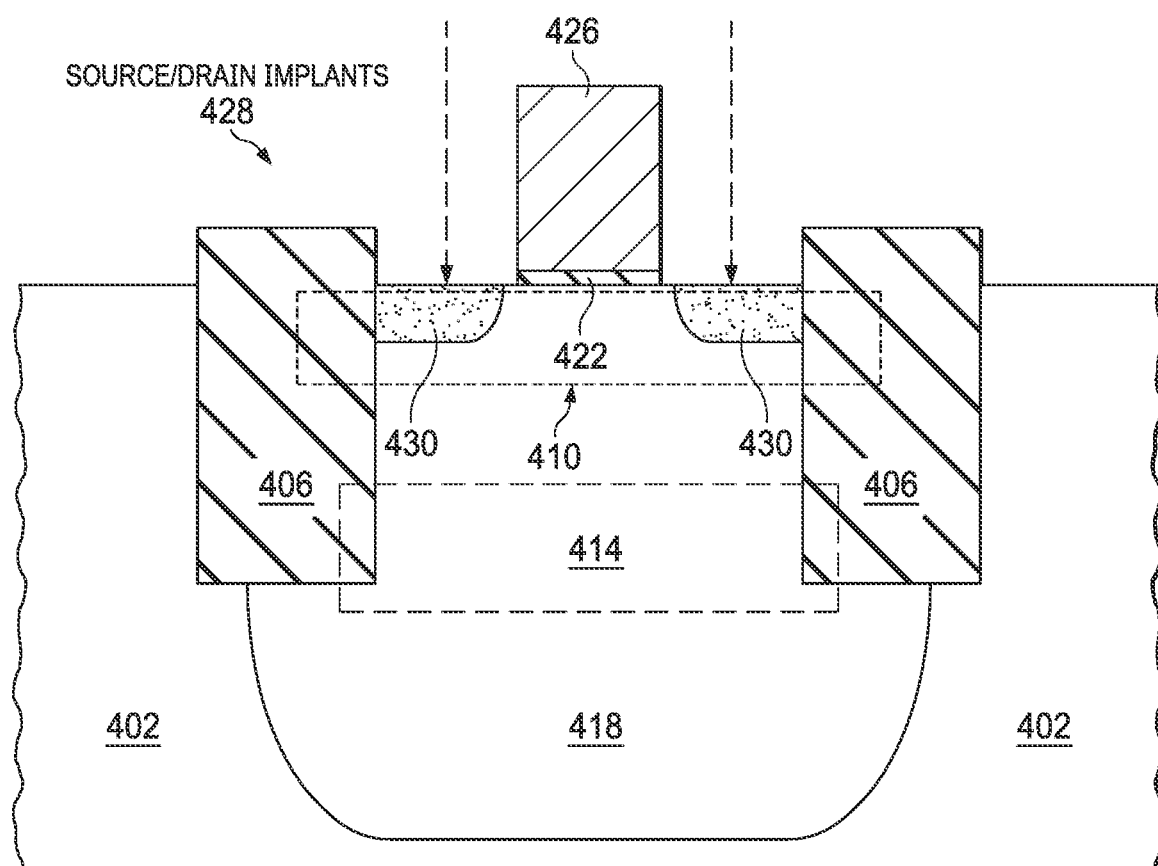
Figure 4I:
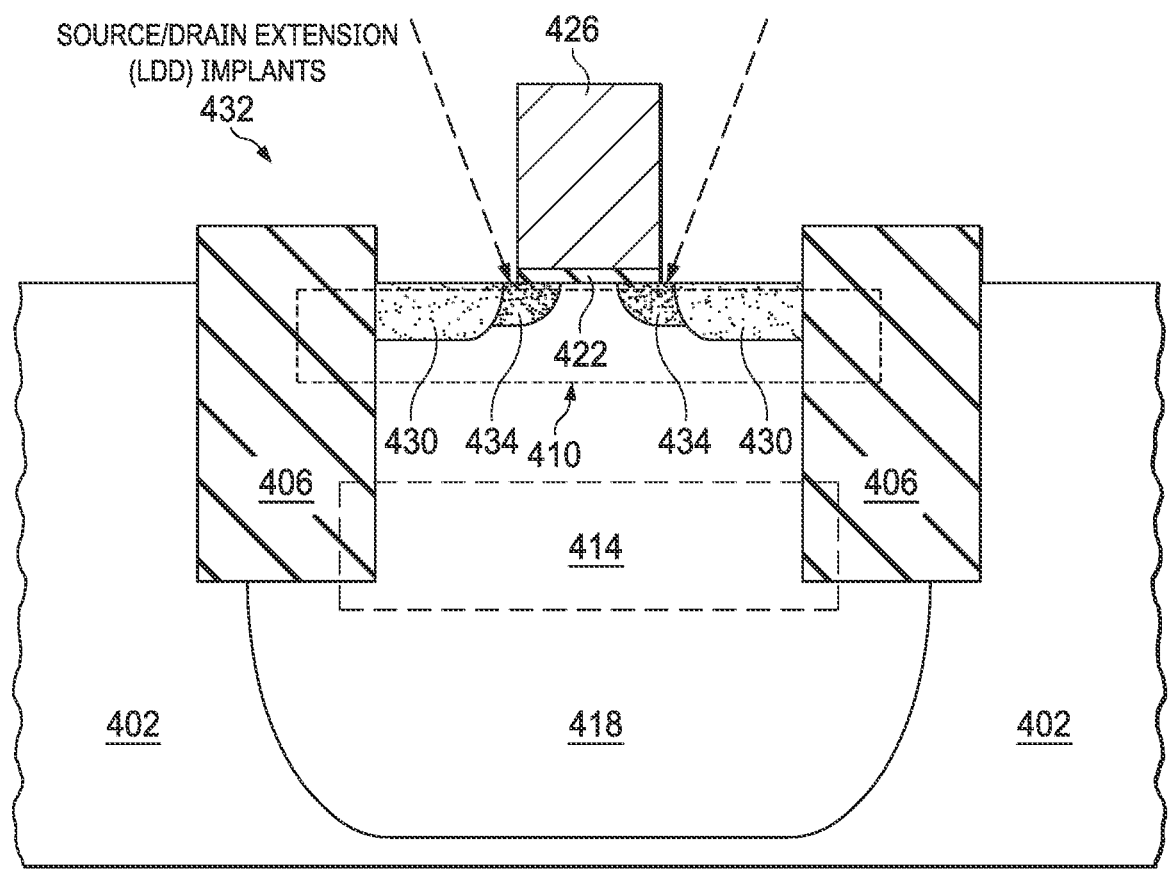

The cross-sectional diagrams of FIGS. 4A through 4I depict the fabrication process of a PMOS transistor 432, shown in FIG. 4I. The process flow shown in FIGS. 4A through 4I illustrates the fabrication of what can be referred to as a baseline transistor, one not having an argon implant for reduced PMOS threshold voltage ($V_t$) mismatch (or an equivalent implant for NMOS). For the purposes of simplicity of illustration, various operations of the fabrication flow, such as masking, etching, deposition, and mask removal have been omitted. The fabrication flow begins with a substrate 402, as shown in cross-section 400 of FIG. 4A. The substrate can be, for example, a single-crystal silicon substrate.

Cross-section 404 of FIG. 4B shows oxide STI barriers 406 formed (e.g., formed at 202, 302 of FIGS. 2 and 3) following a moat pattern or an active pattern in the substrate 402 by intermediate steps that are omitted from illustration. Each STI structure 406 can be formed, for example by etching a trench and filling the trench with oxide. The STI structures 406 formed within the substrate 402 electrically insulate the transistor from other devices fabricated on the same IC. Additionally or alternatively, other isolation structures may be used, such as field oxidation regions (also known as local oxidation of silicon (LOCOS) regions) or implanted isolation regions.

Cross-section 408 of FIG. 4C shows the region of a $V_t$ implant 410 of, for example, arsenic or antimony (in the case of a PMOS transistor). As an example, in this baseline transistor configuration, the $V_t$ implant can be an implant of arsenic implanted (e.g., implanted at 204, 304 of FIGS. 2 and 3) at an energy of about 40 keV with a dose of about $7 \times 10^{11}$ ions/cm$^2$. The $V_t$ implant increases the magnitude of the threshold voltage of the transistor, which, in the context of a PMOS transistor, makes the threshold voltage more negative.

Cross-section 412 of FIG. 4D shows a channel stop region 414 of the transistor with a retrograde implant of an n-type dopant for a PMOS transistor, for example, phosphorus. Implantation (e.g., implanted at 206, 306 of FIGS. 2 and 3) of channel stop region 414 aids in providing isolation between adjacent transistors, by stopping the channel from forming along the sidewalls of the transistor and underneath the bottom of STI barriers 406 which would create leakage from the channel of the transistor in the shallow near-surface region (roughly indicated by $V_t$ implant region 410) to a next adjacent transistor (not shown). As an example, the channel stop implant can be an implant of phosphorus-31 implanted at an energy of about 260 keV with a dose of about $4 \times 10^{12}$ ions/cm$^2$. For example, channel stop region 414 can be implanted at a target depth of between about 0.2 microns and about 0.5 microns, e.g., at about 0.3 microns or at about 0.4 microns.

Cross-section 416 of FIG. 4E shows an n-well region 418 that is implanted and/or diffused into the substrate 402, at a target depth deeper than the target depth of the channel stop 414. The n-well 418 can be formed by implantation (e.g., implanted at 208, 308 of FIGS. 2 and 3) of an n-type dopant for a PMOS transistor, for example, by implantation of phosphorus. As an example, the n-well implant can be an implant of phosphorus-31 implanted at an energy of about 390 keV with a dose of about $2.5 \times 10^{13}$ ions/cm$^2$, in a four-rotation process at beam tilt angles of about 2°. For example, n-well region 418 can be implanted at a target depth of between about 0.6 microns and about 1.0 microns, e.g., at about 0.7 microns or about 0.8 microns. Upon anneal, the n-well implant diffuses, forming a lower boundary shown in FIG. 4E. The n-well 418 may be isolated from other devices formed over the surface of the substrate 402 by the STI structures 406 and/or deep isolation wells (not shown). Although the examples of FIGS. 4C through 4E are illustrated as implanting the $V_t$, channel stop, and well implants in time order of increasing implant target depth, in other examples, not illustrated, these implants may take place in different orders in the fabrication process flow with respect to each other.

Because the implants that form the voltage threshold adjust implant region 410, the channel stop region 414, and the well 418 are generally performed together within the same part of the fabrication process flow, these implants are sometimes collectively referred to in the art as a $V_t$ implant or processing step, or as an SNW implant or processing step. To avoid ambiguity, the use of these terms to refer to multiple different implants collectively is not adopted in the text of the present application. As used herein with respect to the situation of implants within the fabrication process flow, the phrase "prior to formation of a gate" means also prior to the formation of a gate dielectric, and the term "through-gate implant" means an implant performed after formation of a gate and thus also after the formation of a gate dielectric.

Cross-section 420 of FIG. 4F shows the formation of a gate dielectric 422. The gate dielectric layer 422 can include silicon oxide, nitrogen-doped silicon dioxide, an oxynitride such as silicon oxynitride, hafnium oxide, barium strontium titanate (BST), lead zirconate titanate (PZT), a silicate, any other high-k, electrically insulating material, or any combination or stack thereof, such as layers of silicon dioxide and silicon nitride. Gate dielectric layer 422 may be, for example, between about 1 nanometer and about 3 nanometers thick, e.g., about 1, 2, or 3 nanometers thick.

Cross-section 424 of FIG. 4G shows gate electrode 426 having been formed on top of the gate oxide 422. Gate electrode 426 can include polycrystalline silicon (doped p-type for a PMOS transistor), in some examples with a silicide formed on a top surface layer thereof, or can comprise a metal or metal compound such as titanium, aluminum, tungsten, titanium nitride (TiN), titanium aluminum nitride (TiAlN), tantalum, or tantalum nitride (TaN) for replacement metal gate examples.

Cross-section 428 of FIG. 4H shows source/drain regions 430, which include p-type dopants for a PMOS (or n-type dopants for an NMOS), having been implanted on either side of the gate 426. Cross-section 432 of FIG. 4I shows source/drain extensions 434 formed by a PLDD implant. Source/drain extensions 434 can be formed, for example, using a disposable spacer flow, or can be performed later in the flow with a separate pattern level after depositing spacer regions used to space the source/drain regions 430 away from the edge of the gate 426. Source/drain extensions 434 can be doped p-type for PMOS. The source/drain extension implants can also include, for example, a pre-amorphization implant (e.g., of indium at an energy of about 10 keV and a dose of about $3 \times 10^{13}$ ions/cm$^2$) to improve the transistor performance of the PMOS. The ordering of this portion of the fabrication process flow is only an example, as the source/drain extension regions 434 may be formed either earlier or later in the fabrication process flow. The transistor 432 may, in some examples, be further fabricated with spacers (e.g., a dielectric material, not shown) on the sidewalls of the gate stack.

Following implantation, annealing (not illustrated) provides high-temperature thermal process conditions sufficient to cause the dopants in the source, drain, source/drain extension, and channel stop regions to be activated and to diffuse. Annealing can in some cases promote a desired concentration profile of dopants, and in other cases, such as for dopants like phosphorus that are heavy diffusers, an undesirably smeared (as opposed to sharply retrograde) concentration profile. The manufacturing process can continue generally through conventional back end of the line (BEOL) processing including multi-layer metallization and passivation until the final structure of the IC is completed.

Examples can be integrated into a variety of assembly flows to form a variety of different semiconductor IC devices and related products. The assembly can comprise single semiconductor die or multiple semiconductor die, such as package-on-package (PoP) configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, CMOS, BiCMOS, and MEMS.

Figure 5:
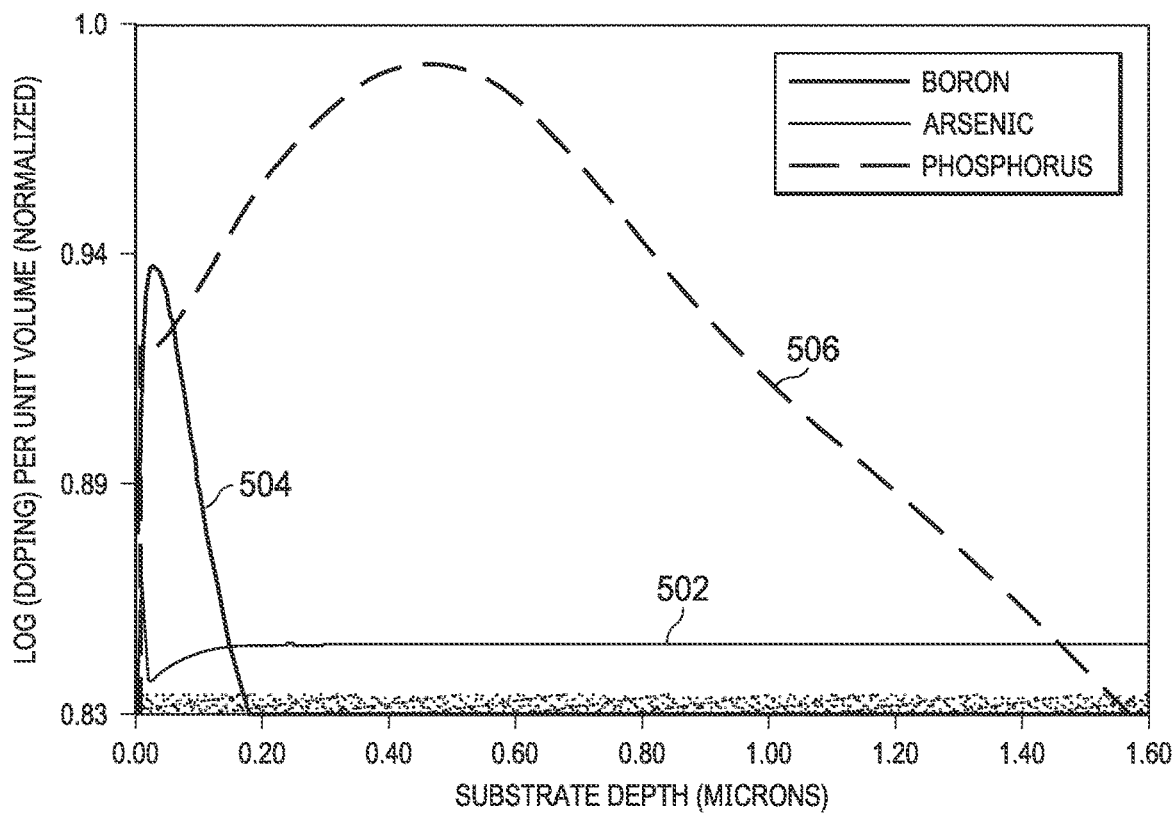
FIG. 5 is a graph showing example dopant concentration profiles for a PMOS transistor fabricated according to the process flow of FIGS. 4A through 4I.

The graph of FIG. 5 is a technology computer-aided design (TCAD) simulated profile, showing dopant concentrations 502, 504, 506 as a function of implant depth following anneal, for dopants boron 502, arsenic 504, and phosphorus 506 present in an example 5 V PMOS FET that does not include a phosphorus-control argon implant. The simulated concentrations thus represent dopant concentrations for a baseline transistor configuration such as the one illustrated in FIGS. 4A through 4I. The boron concentration 502 is relatively low because the example concentration shown is in an n-well. Phosphorus is used as the n-well implant (e.g., the implant to create n-well region 418 in FIG. 4I) and the channel stop implant (e.g., the implant to create channel stop region 414 in FIG. 4I), implants that define the well and the channel stop for isolation. An arsenic implant serves as a $V_t$ implant (e.g., the implant to create region 410 in FIG. 4I), which is a retrograde implant. As shown in FIG. 5, the arsenic desirably does not diffuse much, but instead peaks at approximately 0.05 microns and then rapidly tapers off towards the surface (toward the left side of the graph).

By contrast, the phosphorus concentration does not likewise rapidly diminish toward the surface. In order to achieve improved transistor mismatch, it would be preferable for the phosphorus profile 506 to be retrograde, with very low concentrations near the surface, e.g., at depths shallower than about 0.2 microns or about 0.1 microns, and higher concentrations deeper subsurface. The depletion layer depth in the illustrated example is at approximately 0.04 microns, near the peak of the arsenic concentration plot 504, and thus it would be preferable for the concentration of phosphorus to remain deep and to taper off, at depths about or deeper than this depletion layer depth, to much lower levels in the surface region than the phosphorus levels illustrated by profile 506. However, the phosphorus implants substantially diffuse during anneal, manifesting in FIG. 5 as a relatively high concentration of phosphorus close to the surface (shown at the left end of FIG. 5). Because phosphorus contributes a significant amount of surface doping in the illustrated baseline configuration, the effective doping profile of phosphorus near the surface is non-retrograde, which results in degraded inter-device matching.

Figure 6:
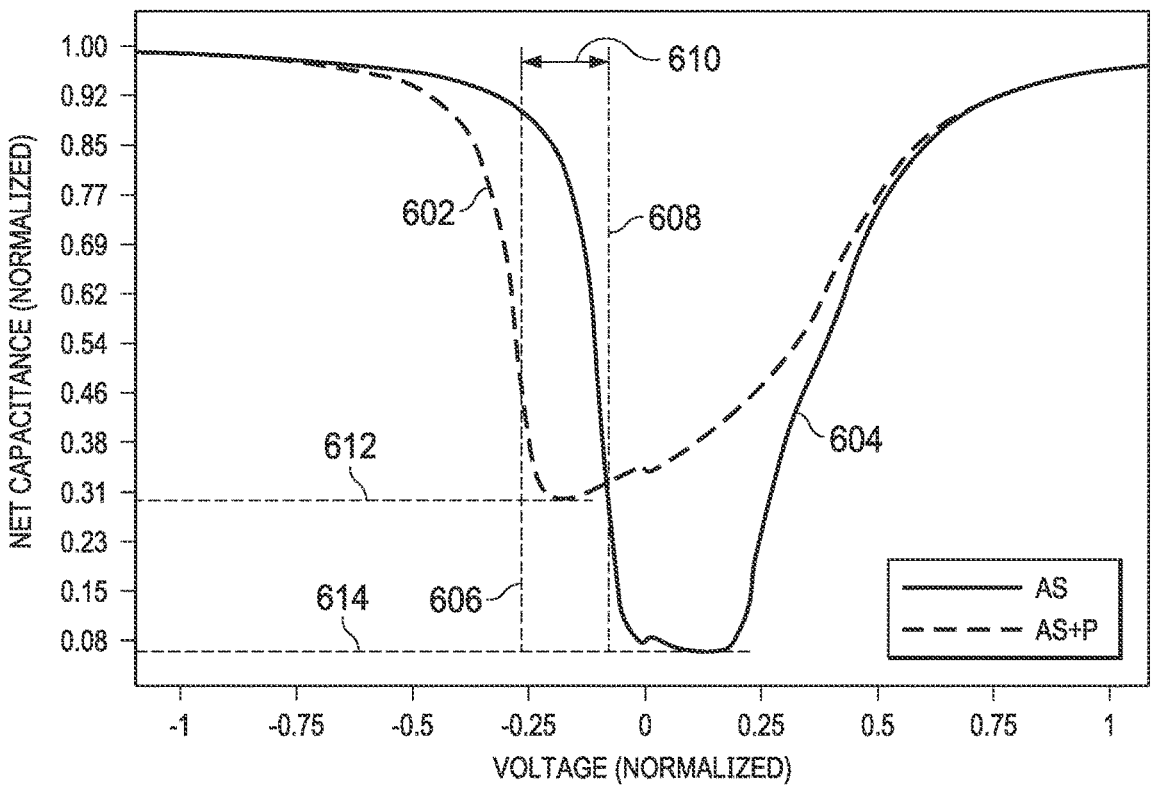
FIG. 6 is a graph showing example simulated capacitance-voltage curves for a first PMOS transistor with only arsenic near the surface and a second PMOS transistor with both arsenic and phosphorus.

The graph of FIG. 6 shows capacitance-voltage (CV) plots for simulation results plotting gate capacitance versus gate voltage 602 for a baseline transistor configuration in which phosphorus bleeds into the region of the arsenic $V_t$ implant near the surface of the transistor substrate following an anneal, as compared to a CV plot 604 for a transistor configuration in which no phosphorus migrates into the arsenic $V_t$ implant region (e.g., region 410 in FIG. 4I) during the anneal. FIG. 6 provides electrical validation that increased phosphorus in the channel is not inactive, but, on the contrary, contributes to the operational characteristics of the transistor.

Both simulated configurations represented by CV plots 602, 604 shown in FIG. 6 include an oxide gate dielectric layer and a polysilicon gate on top of the substrate surface. The CV plot 602 for the baseline configuration, in which the phosphorus bleeds into the arsenic $V_t$ implant region near the surface, shows a threshold voltage $V_t$ (at approximately vertical line 606) of slightly more than 0.25 volts (larger voltage values being labeled as more negative for PMOS), and a high minimum capacitance $C_{min}$ (denoted by horizontal line 612). By contrast, the CV plot 604 for the configuration, in which there is no phosphorus bleed into the $V_t$ implant region, shows that when phosphorus is not permitted to migrate toward the transistor substrate surface, and only arsenic remains in the $V_t$ implant region near the substrate surface, the threshold voltage $V_t$ (as denoted by vertical line 608) is reduced, by an amount between approximately 150 mV and 200 mV. This threshold voltage difference 610 between observed simulated threshold voltages 608, 606 shows that the presence of phosphorus in the near-surface region contributes substantially to the characteristics of the channel of the device, and that, although maintaining a retrograde phosphorus profile can desirably reduce mismatch and can reduce the minimum capacitance $C_{min}$, it can also undesirably reduce the threshold voltage $V_t$, which, in some examples, should be kept to a minimum of about 0.25 volts to maintain low leakage.

A contemplated solution to undesirably high concentrations of phosphorus near the surface might be to increase the target depth of the phosphorus implants, so that less phosphorus migrates to the surface upon anneal. However, because the phosphorus should be implanted at between about 0.2 microns and 0.4 microns to provide isolation between adjacent transistors having shallow trench with a depth of, for example, between 0.3 microns and 0.5 microns, it is not desirable to implant phosphorus too deep. Thus, implanting phosphorus to a depth of, for example, one micron will fail to provide the desired isolation. Another contemplated solution to undesirably high concentrations of phosphorus near the surface might be to use a different ion species as the well and channel stop implant dopants. However, implantation of a species such as arsenic at depths of between 0.3 microns and 0.5 microns would require a very high implantation energy, which may exceed the limits of the current implantation technology, and furthermore, such high-energy implantation of arsenic could damage the transistor substrate more than can be repaired by annealing.

Yet another contemplated solution to undesirably high concentrations of phosphorus near the surface in a PMOS device might be to use a carbon implant to create interstitials that interfere with the back-diffusion of phosphorus. However, although carbon is effective for controlling boron diffusion, a nominal dose of carbon (e.g., a dose of about $1\times10^{14}$ ions/cm$^2$) will not suffice to control phosphorus diffusion in a phosphorus dose range of $1\times10^{13}$ ions/cm$^2$. The large amount of carbon that would be needed for effective control of phosphorus diffusion for a phosphorus dose of this range in a PMOS transistor would cause undesirable side effects in transistor characteristics, such as an increase in leakage in the isolation (channel stop) region. Accordingly, none of these three contemplated solutions suffices to keep phosphorus from coming to the surface in a PMOS transistor while still providing enough phosphorus at the 0.2 micron to 0.6 micron depth to provide the desired isolation and while not causing transistor damage and/or operational side effects.

Figure 10:
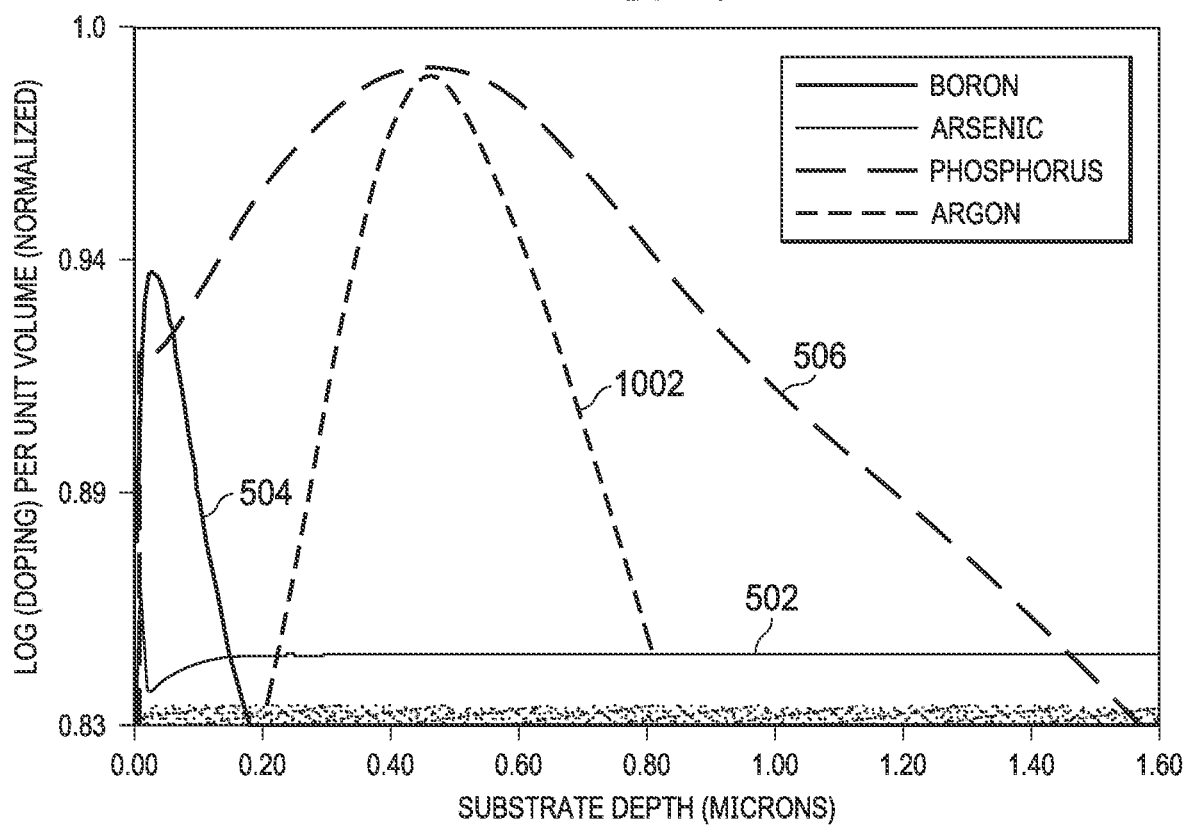
FIG. 10 is the graph of FIG. 5 further showing a concentration profile of an example argon channel stop and well dopant migration control implant.

As described herein, a relatively low-dose argon implant of about $7\times10^{13}$ ions/cm$^2$, at an energy of, for example, about 500 keV, can be implanted to provide interstitials that inhibit the diffusion of phosphorus towards the surface upon anneal in a PMOS device. Prior experimentation showed effective use of an argon implant to prevent phosphorus from diffusing deeper into a silicon substrate. In methods and devices described herein, by contrast, argon implants are leveraged to create interstitials that interfere with the back-diffusion of phosphorus, and thus inhibit the migration of phosphorus toward the substrate surface, reducing mismatch in PMOS transistors. The argon can be implanted to the same transistor substrate depth as the depth having the peak concentration of phosphorus, e.g., at between about 0.3 microns and about 0.55 microns, or at any shallower depth that does not cause substantial degradation of subsequent gate oxide growth. In some examples, the argon can be implanted at any depth between the peak of the phosphorus and the surface, without the implant being so shallow as to cause substantial degradation of subsequent gate oxide growth. FIG. 10, discussed below, shows an example migration control implant target depth. In some examples, a migration control implant (e.g., of argon) is implanted to a target depth that is at about the target depth at which a channel stop implant (e.g., of phosphorus) or an n-well implant (e.g., of phosphorus) is implanted. In some examples, a migration control implant is implanted to a target depth that is within one sigma of a peak concentration depth of a channel stop implant or an n-well implant. In some examples, a migration control implant is implanted to a target depth that is within plus or minus 0.2 microns of a peak concentration depth of a channel stop implant or an n-well implant. At such migration control implant depths, the migration control implant effectively keeps the implanted channel stop implant ions and/or n-well implant ions from migrating near the transistor substrate surface during anneal.

In some examples, the migration control implant (e.g., of argon) is implanted around the time of the well and $V_t$ implants, at about the same part of the fabrication flow as the phosphorus is implanted, either before or after well and channel stop (e.g., phosphorus) implantation. In these examples, the migration control implant is implanted after shallow trench isolation (STI) and prior to growth or deposition of the gate oxide and before formation of the gate. For example, the migration control implant can be implanted at an energy of between about 150 keV and about 600 keV, e.g., about 500 keV, with a dose of between about $1 \times 10^{13}$ ions/cm$^2$ and about $1 \times 10^{14}$ ions/cm$^2$, e.g., about $7 \times 10^{13}$ ions/cm$^2$, in a four-rotation process at beam tilt angles of between about 0° from the vertical and about 10° from the vertical, e.g., about 2° from the vertical. A small amount of tilt, e.g., about 2° tilt, on the migration control implant can help avoid channeling, which can in any case be expected to be minimal in the example dose ranges and implant depth ranges.

Figure 7:
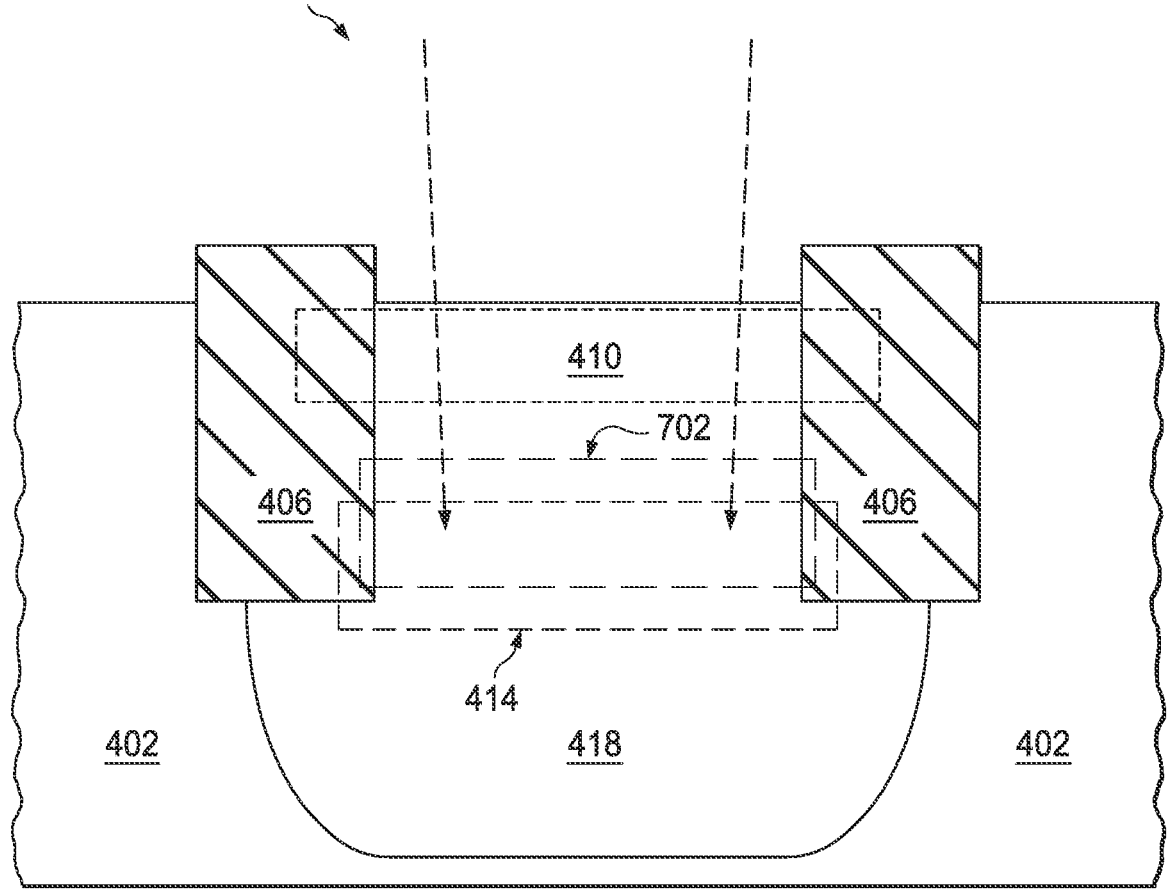
FIG. 7 is a cross-sectional view of a portion of an example transistor at a part of the process flow, placed sequentially between FIGS. 4E and 4F, having a channel stop and well dopant migration control implant prior to gate formation.

FIG. 7 shows an example cross-section 700 illustrating an example channel stop/well dopant migration control implant, at about region 702. The example channel stop/well dopant migration control implant may occur within the fabrication process flow between FIGS. 4E and 4F, such as after the channel stop and well implants (shown in FIGS. 4D and 4E) and before the gate dielectric deposition (shown in FIG. 4F). The term "channel stop/well dopant" refers to an implant dopant used to form the channel stop region, the well region, or both. "Migration" refers to diffusion of ions throughout the substrate upon anneal, which can smear what would otherwise be a sharply retrograde concentration profile. Although illustrated as taking place after the channel stop and well implants, the channel stop/well dopant migration control implant (e.g., of argon) can take place within the process flow either after or before the channel stop and well implants (e.g., of phosphorus), or in between them.

In these examples in which the migration control implant (e.g., of argon for PMOS transistors) is implanted along with the well and $V_t$ implants, the argon can interfere with the gate oxide growth process if implanted too close to the transistor substrate surface, so in these examples, the argon can be implanted at a target depth that is around the depth of the peak phosphorus concentration and not substantially shallower, e.g., not less than 0.05 microns deep, e.g., not less than 0.1 microns deep, e.g., not less than 0.2 microns deep. To avoid or mitigate side effects of the argon implant on non-targeted transistors on the IC (transistors that are not the specific target of the argon implant, e.g., embedded double-diffused MOS (DMOS) transistors, laterally-diffused MOS (LDMOS) transistors, or transistors that do not form matched pairs), non-targeted transistors can either be masked off during the argon implant or can be engineered to ensure that the effect of the phosphorus not migrating to the surface is accounted for in the designs of the non-targeted transistors. Masking non-targeted transistors may increase fabrication cost, incurring additional expensive mask level processing steps in the fabrication flow. By contrast, engineering non-targeted transistors to comprehend more retrograde phosphorus profiles saves the additional mask, but may add to design costs.

Figure 8:
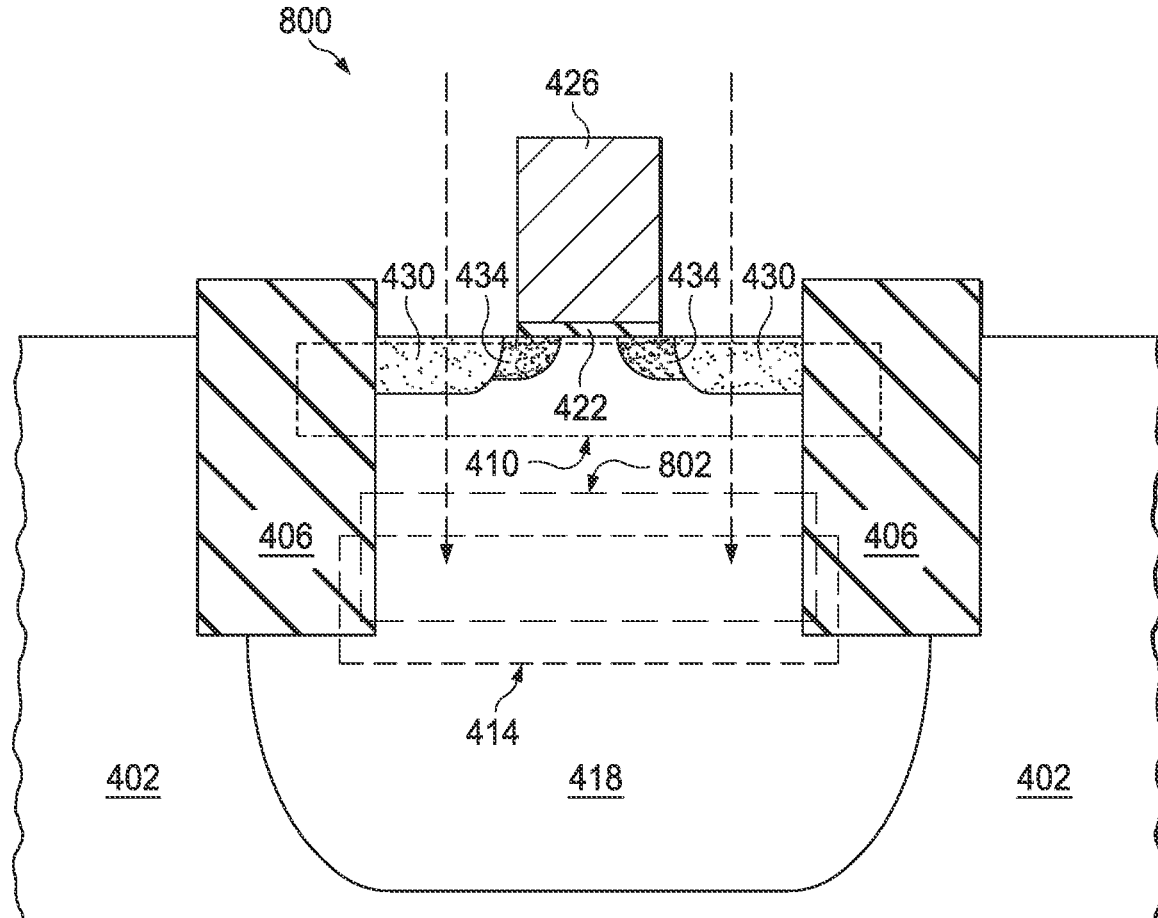
FIG. 8 is a cross-sectional view of a portion of an example transistor at a part of the process flow, placed sequentially after FIG. 4I, having a through-gate channel stop and well dopant migration control implant.

In other examples, the migration control implant (e.g., argon) is implanted through the gate, in target transistors that have source/drain extensions (e.g., LDDs), after gate formation, at about the same portion of the fabrication flow in which the source/drain extensions are implanted. For example, the migration control implant (e.g., argon) can be implanted through the gate at an energy of between about 150 keV and about 250 keV, e.g., about 170 keV or 200 keV, with a dose of between about $1 \times 10^{13}$ ions/cm$^2$ and about $1 \times 10^{14}$ ions/cm$^2$, at beam tilt angles of between about 0° and about 30°, e.g., at beam tilt angles of about 0° (straight down through the gate). FIG. 8 shows an example cross-section 800 illustrating such a channel stop/well dopant migration control implant, at about region 802, such as taking place within the fabrication process flow after the completion of gate formation as shown in FIG. 4I.

In these examples in which the migration control implant (e.g., argon) is implanted through the gate, no concern is posed with implanting the migration control implant too shallow, because once the oxide has already been grown, a subsequent migration control implant cannot interfere with gate oxide growth. Additionally, in these examples in which the migration control implant (e.g., argon) is implanted through the gate, non-targeted transistors are unaffected without any additional masking process because the non-targeted transistors are already masked off during the source/drain extension implant portion of the fabrication flow.

In examples where a migration control implant is provided and, consequently, the well and channel stop implant ions are inhibited from migrating close to the transistor substrate surface during anneal, the value of the threshold voltage of the transistor can be undesirably impacted. A threshold voltage of a sufficient value (e.g., at least about 0.5 volts) is needed to keep the leakage low. Therefore, in such examples having the migration control implant, additional arsenic or antimony can be added to recover the threshold voltage to a sufficiently high value. As one example, the initial dose of the $V_t$ implant can be increased to compensate for the reduced number of ions near the surface. For example, an initial arsenic $V_t$ implant can be implanted with an increased dose of between about $1 \times 10^{12}$ ions/cm$^2$ and about $3\times10^{12}$ ions/cm$^2$, e.g., about $1.0\times10^{12}$ ions/cm$^2$, or about $2.0\times10^{12}$ ions/cm$^2$, or about $2.7\times10^{12}$ ions/cm$^2$, at an energy of about 40 keV. As another example, a second, through-gate $V_t$ implant can be performed to readjust the threshold voltage. For example, a through-gate $V_t$ implant of arsenic can be performed with an energy of between about 200 keV and about 300 keV, e.g., about 250 keV, with a dose of between about $1\times10^{12}$ ions/cm$^2$ and about $1\times10^{13}$ ions/cm$^2$, at a tilt angle of between about 0° and about 30°, e.g., about 0° (straight down through the gate). The increased initial $V_t$ implant dose, or the additional through-gate $V_t$ implant, can help to recover the threshold voltage of the transistor back up to as desired level (e.g., about 0.5 volts) while still maintaining the improved mismatch achieved by enhancing the retrograde nature of the channel stop/well implant (e.g., phosphorus). The additional arsenic will not diffuse substantially upon anneal.

Figure 9:
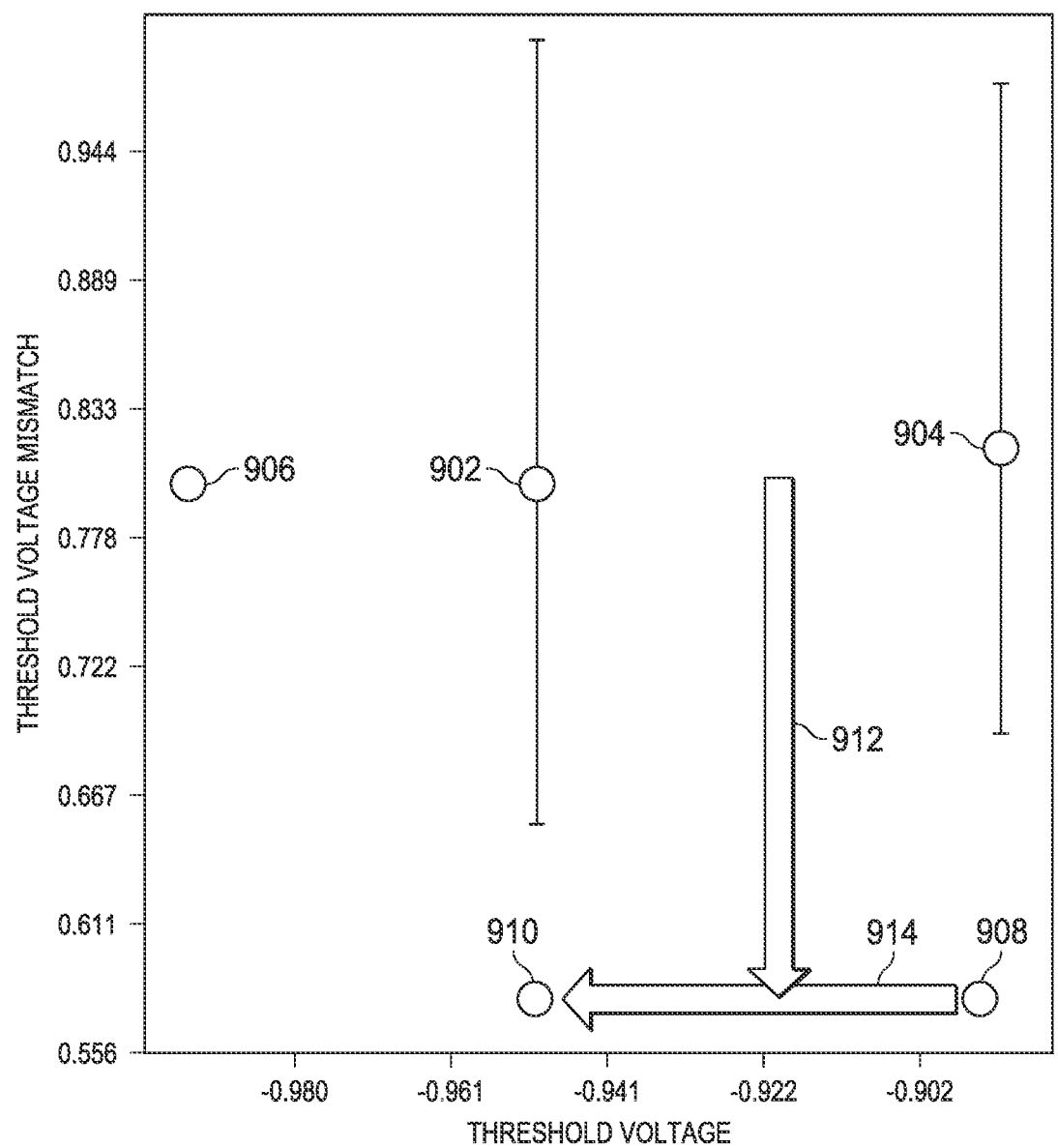
FIG. 9 is a graph of threshold voltage versus threshold voltage mismatch for transistors fabricated according to a baseline method and methods using a through-gate channel stop and well dopant migration control implant.

FIG. 9 is a graph of threshold voltage versus threshold voltage mismatch (both axes normalized) for fabricated transistors. Point 902 represents a median value of $V_t$ mismatch for baseline transistors fabricated to have a first, higher threshold voltage (higher meaning more negative for PMOS). The point 902 is representative of a set of points having a spread in the $V_t$ mismatch, the spread being due to normal fabrication process variation, the spread being indicated in FIG. 9 by vertical error bars. Point 904 represents a median value of $V_t$ mismatch for baseline transistors fabricated to have a second, lower threshold voltage (lower meaning less negative for PMOS), e.g., by varying the dose of the threshold voltage adjust implant (of arsenic in the illustrated examples). The point 904 is likewise representative of a set of points having a spread in the $V_t$ mismatch. These baseline transistors are fabricated according to the process illustrated by FIGS. 4A through 4I and have not received a channel stop and well dopant migration control implant (e.g., argon). Median point 904 is likewise illustrated with error bars indicative of process spread.

Point 906 in FIG. 9 represents a median value of $V_t$ mismatch for transistors fabricated according to the baseline process flow but which have received an additional through-gate implant of the threshold voltage adjust implant (extra arsenic in the illustrated example) to raise the threshold voltage to a third, higher $V_t$ value, as shown by point 906 being further to the left on the graph. Transistors represented by all three of points 902, 904, 906 exhibit relatively high $V_t$ mismatch as a consequence of channel stop and well implant migration during anneal resulting in a non-retrograde concentration profile of the channel stop and well implants (of phosphorus in the illustrated examples).

Transistors represented by median points 908, 910 in FIG. 9 have been fabricated to include a channel stop and well dopant migration control implant (of argon at an energy of 170 keV in the illustrated examples), implanted using the through-gate process described above. The addition of the channel stop and well dopant migration control implant desirably reduces the average $V_t$ mismatch threshold voltage, as shown by downward-pointing arrow 912 in the graph of FIG. 9. Similar to transistors represented by median point 906, transistors represented by median point 910 have been fabricated with an additional through-gate implant of the threshold voltage adjust implant (extra arsenic in the illustrated example) to raise the magnitude of the threshold voltage as compared to the transistors represented by median point 908, as indicated by leftward-pointing arrow 914 in the graph of FIG. 9. FIG. 9 thus shows that transistors fabricated with a channel stop and well dopant migration control implant (e.g., argon) exhibit significant improvement 912 in $V_t$ mismatch, below the distribution of the baseline, and transistors that additionally have been treated with an extra compensating dose of $V_t$ implant (e.g., arsenic or antimony) through the gate improve 914 in threshold voltage as well.

The graph of FIG. 10 illustrates an example implant concentration profile 1002 of a channel stop and well dopant migration control implant (argon in the illustrated example) relative to the other plotted concentration profiles of FIG. 6. As shown in FIG. 10, the peak concentration of the channel stop and well dopant migration control implant (argon in the illustrated example) is positioned near the dopant concentration peak of the existing channel stop and well implant (e.g., phosphorus in the illustrated example). FIG. 10 does not, however, illustrate the post-anneal change to the concentration profile 506 of the channel stop and well implant (phosphorus in the illustrated example) that would result from the provision of the channel stop and well dopant migration control implant.

Figure 11:
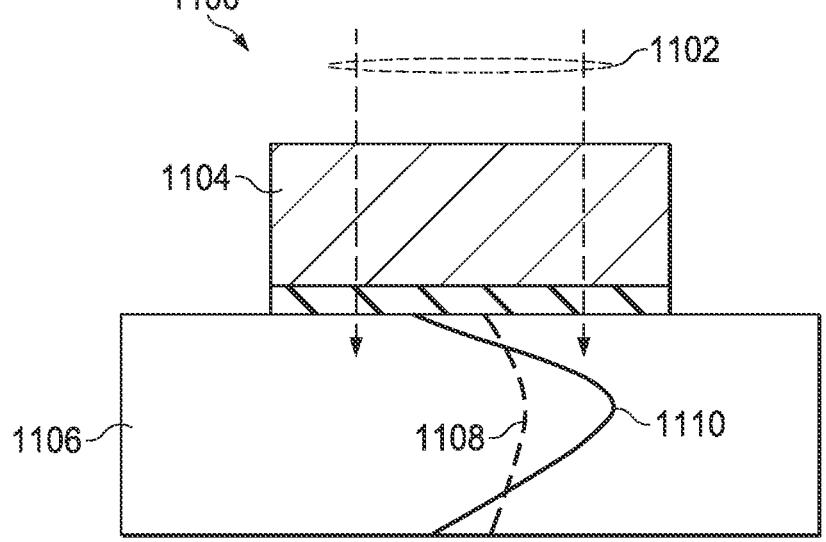
FIG. 11 is a cross-sectional schematic of a portion of a transistor showing the effect on the channel stop and well implant dopant concentration profile of a through-gate channel stop and well dopant migration control implant.

FIG. 11 is a conceptual cross-sectional schematic 1100 illustrating a channel stop and well dopant migration control implant (e.g., argon) 1102 implanted through the gate 1104 of a transistor into the transistor's substrate 1106. FIG. 11 also shows concentration profiles 1108, 1110 of the channel stop and well implant dopant (e.g., phosphorus), illustrated within the substrate 1106. In the respective profile curves 1108, 1110, points further to the right indicate higher ion concentration in concentration profile curves 1108, 1110. The profile curve 1108 illustrates the case where no channel stop and well dopant migration control implant (e.g., of argon) is provided, thus illustrating the baseline concentration profile 1108 of the channel stop and well implant dopant (e.g., phosphorus) as being more flat in comparison to the concentration profile 1110 of the channel stop and well implant dopant in the case where a channel stop and well dopant migration control implant (e.g., of argon) is provided. This concentration profile 1110 is more sharply retrograde because the channel stop and well implant dopant is effectively controlled from migrating to the surface upon anneal.

Descriptions above have generally been for PMOS examples without implied limitation. For NMOS examples, carbon or nitrogen can be used instead of argon as the channel stop and well dopant migration control implant, indium, boron, or difluoroboryl ($BF_2$) can be used for the $V_t$ control implant, and boron or $BF_2$ can be used for the p-well and channel-stop implants.

In this description, the term "based on" means based at least in part on. Also, in this description, the term "couple" or "couples" means either an indirect or direct wired or wireless connection. Thus, if a first device, element, or component couples to a second device, element, or component, that coupling may be through a direct coupling or through an indirect coupling via other devices, elements, or components and connections. Similarly, a device, element, or component that is coupled between a first component or location and a second component or location may be through a direct connection or through an indirect connection via other devices, elements, or components and/or couplings. Modifications are possible in the described embodiments, and other embodiments are possible, within the scope of the claims.

What is claimed is:

1. A method of fabricating an integrated circuit, the method comprising:

performing a first implant into a transistor region of a semiconductor substrate thereby producing an arsenic or antimony profile having a peak concentration at a first depth;

performing a second implant into the transistor region thereby producing a phosphorus profile having a peak concentration at a second depth greater than the first depth; and performing a third implant into the transistor region thereby producing an argon profile having a peak concentration at a third depth that is greater than the first depth and about equal to the second depth, wherein the second implant is a channel stop implant and the third implant is a channel stop dopant migration control implant, the method further comprising:

performing a fourth implant into the transistor region, the fourth implant being a well implant having a peak dopant concentration of phosphorus at a fourth depth that is greater than the second depth; and performing a fifth implant into the transistor region, the fifth implant being a well implant dopant migration control implant of argon targeted to a fifth depth that is at or about the fourth depth.

2. The method of claim 1, wherein the third depth is within ±250 nanometers of the second depth.

3. The method of claim 1, wherein the fifth depth is within ±250 nanometers of the fourth depth.

4. The method of claim 1, wherein the third depth is less than the second depth.

5. The method of claim 1, further comprising forming a source and a drain in the transistor region, the peak concentrations being located between the source and the drain.

6. The method of claim 1, wherein the phosphorus profile includes dopant from a channel stop implant and an n-well implant.

7. The method of claim 6, wherein the third implant is a phosphorus migration control implant that inhibits dopant from at least one of the channel stop implant or the n-well implant from migrating to shallower than the first depth in response to annealing.

8. The method of claim 1, wherein the first implant is a first threshold voltage adjust implant, the method further comprising forming a gate over the transistor region and subsequently performing a second threshold voltage adjust implant as a through-gate implant.

9. The method of claim 8, wherein the second threshold voltage adjust implant is performed at an energy of between about 200 keV and about 300 keV with a dose of between about $1\times10^{12}$ ions/cm$^2$ and about $1\times10^{13}$ ions/cm$^2$ at a tilt angle of between about 0° and about 30°.

10. The method of claim 1, wherein the first implant is performed with a dose of between about $1\times10^{11}$ ions/cm$^2$ and about $1\times10^{13}$ ions/cm$^2$.

11. The method of claim 1, wherein the third implant is performed prior to formation of a gate over the transistor region.

12. The method of claim 11, wherein the third implant is performed at an energy of between about 150 keV and about 600 keV with a dose of between about $1\times10^{13}$ ions/cm$^2$ and about $1\times10^{14}$ ions/cm$^2$.

13. The method of claim 12, wherein the third implant is performed in a four-rotation process at respective beam tilt angles of between about 0° from the surface normal and about 10° from the surface normal.

14. The method of claim 1, wherein the third implant is performed as a through-gate implant.

15. The method of claim 14, wherein the third implant is performed at an energy of between about 150 keV and about 250 keV with a dose of between about $1\times10^{13}$ ions/cm$^2$ and about $1\times10^{14}$ ions/cm$^2$.

16. The method of claim 15, wherein the third implant is performed at beam tilt angles of between about 0° and about 30°.

17. A method of fabricating a metal-oxide-semiconductor (MOS) transistor, the method comprising:

performing a threshold voltage adjust implant into a semiconductor substrate to a first target depth;

performing a channel stop implant into the semiconductor substrate to a second target depth that is deeper than the first target depth;

performing a well implant into the semiconductor substrate to a third target depth that is deeper than the second target depth; and performing a channel stop/well dopant migration control implant into the semiconductor substrate to a fourth target depth that is at or near the third target depth.

18. The method of claim 17, wherein the MOS transistor is a PMOS transistor, the threshold voltage adjust implant comprises implanting arsenic or antimony, the channel stop and well implants comprise implanting phosphorus, and the channel stop/well dopant migration control implant comprises implanting argon.

19. The method of claim 18, wherein the channel stop/well dopant migration control implant is performed prior to gate formation.

20. The method of claim 18, further comprising forming a gate of the PMOS transistor, and wherein the channel stop/well dopant migration control implant is a through-gate implant after gate formation.

21. The method of claim 20, wherein either:

the threshold voltage adjust implant is a through-gate implant performed after gate formation, or the threshold voltage adjust implant is a first threshold voltage adjust implant that is performed prior to gate formation, and the method further comprises a second threshold voltage adjust implant that is a through-gate implant performed after gate formation.

22. A method of fabricating an integrated circuit, the method comprising:

performing a first implant into a transistor region of a semiconductor substrate thereby producing an arsenic or antimony profile having a peak concentration at a first depth;

performing a second implant into the transistor region thereby producing a phosphorus profile having a peak concentration at a second depth greater than the first depth; and performing a third implant into the transistor region thereby producing an argon profile having a peak concentration at a third depth greater than the first depth, wherein the phosphorus profile includes dopant from a channel stop implant and an n-well implant.

23. A method of fabricating an integrated circuit, the method comprising:

performing a first implant into a transistor region of a semiconductor substrate thereby producing an arsenic or antimony profile having a peak concentration at a first depth;

performing a second implant into the transistor region thereby producing a phosphorus profile having a peak concentration at a second depth greater than the first depth; and performing a third implant into the transistor region thereby producing an argon profile having a peak concentration at a third depth greater than the first depth, wherein the first implant is a first threshold voltage adjust implant, the method further comprising forming a gate over the transistor region and subsequently performing a second threshold voltage adjust implant as a through-gate implant.

24. A method of fabricating an integrated circuit, the method comprising:

performing a first implant into a transistor region of a semiconductor substrate thereby producing an arsenic or antimony profile having a peak concentration at a first depth;

performing a second implant into the transistor region thereby producing a phosphorus profile having a peak concentration at a second depth greater than the first depth; and performing a third implant into the transistor region thereby producing an argon profile having a peak concentration at a third depth greater than the first depth, wherein the third implant is performed prior to formation of a gate over the transistor region, the third implant is performed at an energy of between about 150 keV and about 600 keV with a dose of between about $1 \times 10^{13}$ ions/cm$^2$ and about $1 \times 10^{14}$ ions/cm$^2$, and the third implant is performed in a four-rotation process at respective beam tilt angles of between about 0° from the vertical surface normal and about 10° from the vertical surface normal.

25. A method of fabricating an integrated circuit, the method comprising:

performing a first implant into a transistor region of a semiconductor substrate thereby producing an arsenic or antimony profile having a peak concentration at a first depth;

performing a second implant into the transistor region thereby producing a phosphorus profile having a peak concentration at a second depth greater than the first depth; and performing a third implant into the transistor region thereby producing an argon profile having a peak concentration at a third depth greater than the first depth, wherein the third implant is performed as a through-gate implant, the third implant is performed at an energy of between about 150 keV and about 250 keV with a dose of between about $1 \times 10^{13}$ ions/cm$^2$ and about $1 \times 10^{14}$ ions/cm$^2$, and the third implant is performed at beam tilt angles of between about 0° and about 30°.

* * * * *